(12) United States Patent
Hsiao et al.

(10) Patent No.: US 8,847,387 B2
(45) Date of Patent: Sep. 30, 2014

(54) ROBUST JOINT STRUCTURE FOR FLIP-CHIP BONDING

(75) Inventors: Ching-Wen Hsiao, Banqiao (TW);
Yao-Chun Chuang, Taipei (TW);
Chen-Shien Chen, Zhubei (TW);
Chen-Cheng Kuo, Chu-Pei (TW);
Ru-Ying Huang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 12/842,304

(22) Filed: Jul. 23, 2010

(65) Prior Publication Data

US 2011/0101519 A1 May 5, 2011

Related U.S. Application Data

(60) Provisional application No. 61/256,199, filed on Oct. 29, 2009, provisional application No. 61/256,090, filed on Oct. 29, 2009.

(51) Int. Cl.
*H01L 23/48* (2006.01)
*H01L 23/00* (2006.01)
*H01L 23/498* (2006.01)

(52) U.S. Cl.
CPC . *H01L 23/49827* (2013.01); *H01L 2224/16145* (2013.01); *H01L 2924/01322* (2013.01); *H01L 2224/05075* (2013.01); *H01L 2924/01006* (2013.01); *H01L 2224/16238* (2013.01); *H01L 24/11* (2013.01); *H01L 24/13* (2013.01); *H01L 24/16* (2013.01); *H01L 2224/05184* (2013.01); *H01L 2224/13022* (2013.01); *H01L 24/81* (2013.01); *H01L 2224/16227* (2013.01); *H01L 2224/05139* (2013.01); *H01L 2924/01082* (2013.01); *H01L 2224/81203* (2013.01); *H01L 2224/13655* (2013.01); *H01L 2224/13582* (2013.01); *H01L 2224/05572* (2013.01); *H01L 2224/81193* (2013.01); *H01L 2924/01074* (2013.01); *H01L 2224/13116* (2013.01); *H01L 2224/13083* (2013.01); *H01L 23/49816* (2013.01); *H01L 2224/1146* (2013.01); *H01L 2224/16148* (2013.01); *H01L 2924/01047* (2013.01); *H01L 2224/05022* (2013.01); *H01L 2224/13111* (2013.01); *H01L 2224/05655* (2013.01); *H01L 2224/16225* (2013.01); *H01L 2224/05144* (2013.01); *H01L 2224/13155* (2013.01); *H01L 2224/1147* (2013.01); *H01L 2924/01029* (2013.01); *H01L 2924/01019* (2013.01); *H01L 2224/05647* (2013.01); *H01L 2224/131* (2013.01); *H01L 2924/014* (2013.01); *H01L 2924/01033* (2013.01); *H01L 2224/05666* (2013.01); *H01L 2224/13147* (2013.01); *H01L 2224/05147* (2013.01); *H01L 2224/13562* (2013.01); *H01L 2924/01079* (2013.01); *H01L 2224/05073* (2013.01); *H01L 2224/05571* (2013.01); *H01L 2924/01023* (2013.01); *H01L 2224/13644* (2013.01); *H01L 2224/05582* (2013.01); *H01L 2224/13144* (2013.01); *H01L 2224/81815* (2013.01); *H01L 2924/01013* (2013.01); *H01L 2224/05155* (2013.01)
USPC .......................... 257/737; 257/685; 257/686

(58) Field of Classification Search
CPC ......... H01L 24/03; H01L 24/05; H01L 24/10; H01L 24/11; H01L 24/12; H01L 24/15
USPC .......................................... 257/737, 685, 686
See application file for complete search history.

(56) References Cited

U.S. PATENT DOCUMENTS

| | | |
|---|---|---|
| 6,218,281 B1 | 4/2001 | Watanabe et al. |
| 6,229,220 B1 | 5/2001 | Saitoh et al. |
| 6,399,475 B1 | 6/2002 | Petit |
| 6,462,427 B2 | 10/2002 | Sakiyama et al. |
| 6,462,467 B1 | 10/2002 | Russ |
| 6,578,754 B1 | 6/2003 | Tung |
| 6,592,019 B2 | 7/2003 | Tung |
| 6,614,113 B2 | 9/2003 | Watanabe et al. |
| 6,818,545 B2 | 11/2004 | Lee et al. |
| 6,853,076 B2 | 2/2005 | Datta et al. |
| 6,917,119 B2 | 7/2005 | Lee et al. |
| 7,064,436 B2 | 6/2006 | Ishiguri et al. |
| 7,276,801 B2 * | 10/2007 | Dubin et al. .......... 257/779 |
| 7,361,990 B2 | 4/2008 | Lu et al. |
| 7,391,112 B2 | 6/2008 | Li et al. |
| 7,911,048 B2 | 3/2011 | Murayama |
| 7,939,939 B1 * | 5/2011 | Zeng et al. ............ 257/737 |
| 2005/0151268 A1 | 7/2005 | Boyd et al. |
| 2006/0220244 A1 * | 10/2006 | Lu et al. ............... 257/738 |
| 2008/0142994 A1 * | 6/2008 | Lu et al. ............... 257/778 |
| 2008/0296764 A1 | 12/2008 | Chang et al. |
| 2009/0011543 A1 | 1/2009 | Karta et al. |
| 2009/0026608 A1 | 1/2009 | Tsai et al. |
| 2009/0090543 A1 | 4/2009 | Furuyama et al. |
| 2009/0130840 A1 | 5/2009 | Wang et al. |
| 2009/0146303 A1 * | 6/2009 | Kwon ................... 257/741 |

FOREIGN PATENT DOCUMENTS

| | | |
|---|---|---|
| JP | 5335313 A | 12/1993 |
| JP | 2000228420 A | 8/2000 |
| JP | 2006261641 A | 9/2006 |
| KR | 10-1999-0059688 A | 7/1999 |
| KR | 2009-0035425 A | 4/2009 |

OTHER PUBLICATIONS

Korean Office Action regarding Korean Patent Application No. 10-2010-0096044, dated Sep. 28, 2012, 10 pages.

\* cited by examiner

*Primary Examiner* — David Vu
*Assistant Examiner* — Brandon Fox
(74) *Attorney, Agent, or Firm* — Slater & Matsil, L.L.P.

(57) ABSTRACT

An integrated circuit structure includes a first work piece and a second work piece. The first work piece includes a copper bump at a main surface of the first work piece and having a first dimension; and a nickel-containing barrier layer over and adjoining the copper bump. The second work piece is bonded to the first work piece and includes a bond pad at a main surface of the second work piece; and a solder mask at the main surface of the second work piece and having a solder resist opening with a second dimension exposing a portion of the bond pad. A ratio of the first dimension to the second dimension is greater than about 1. Further, a solder region electrically connects the copper bump to the bond pad, with a vertical distance between the bond pad and the copper bump being greater than about 30 μm.

15 Claims, 5 Drawing Sheets

ROBUST JOINT STRUCTURE FOR FLIP-CHIP BONDING

This application claims the benefit of U.S. Provisional Application No. 61/256,199 filed on Oct. 29, 2009, entitled "Robust Joint Structure for Flip-Chip Bonding," which application is hereby incorporated herein by reference.

CROSS-REFERENCE TO RELATED APPLICATION

This application relates to the following U.S. Patent Application: Application Ser. No. 61/256,090, filed Oct. 29, 2009, and entitled "Copper Bump Joint Structures with Improved Crack Resistance," which application is hereby incorporated herein by reference.

TECHNICAL FIELD

This disclosure relates generally to integrated circuits and more particularly to flip-chip bond structures.

BACKGROUND

In the formation of semiconductor chips/wafers, integrated circuit devices, such as transistors are formed at the surfaces of semiconductor substrates in the semiconductor chips/wafers. Interconnect structures are then formed over the integrated circuit devices. Metal or solder bumps are formed on the surfaces of the semiconductor chips/wafers, so that the integrated circuit devices can be accessed.

In the packaging of the semiconductor chips, the semiconductor chips are often bonded with package substrates using flip-chip bonding. Solders are used to join the metal bumps in the semiconductor chips to bond pads in the package substrates. Conventionally, eutectic solder materials containing lead (Pb) and tin (Sn) were used for bonding the metal bumps. For example, a commonly used lead-containing eutectic solder has about 63% tin (Sn) and 37% lead (Pb). This combination gives the solder material a suitable melting point and a low electrical resistivity. Further, the eutectic solders have a good crack-resistance.

Lead is a toxic material and hence lead-free solder bumps are preferred. Solutions to replace lead-containing solders with lead-free solders are thus explored. However, the commonly known lead-free solders, such as SnAg, SnAgCu, and their inter-metallic components, are too brittle and hence suffer from the cracking problem. As a result, the solder joints formed of lead-free solders are often not reliable enough and cannot pass reliability tests, such as thermal cycles.

Solder cracking is typically caused by stress. The coefficient of thermal expansion (CTE) mismatch between materials in the package assemblies is one of the main reasons causing the stress. For example, silicon substrates typically have CTE equal to about 3 ppm/° C., low-k dielectric materials may have CTEs equal to about 20 ppm/° C., while the package substrates may have CTEs equal to about 17 ppm/° C. The significant difference in CTEs results in stress being applied to the structure when a thermal change occurs. The use of copper in the metal bumps further worsens the problem. Since copper is rigid, a high stress may be applied on the solders adjoining the copper bumps and hence the solders are more prone to the cracking. For example, the process window for the reflow, which indicates how many repeated reflows the solders can endure without incurring significant cracks, may be too narrow for mass production of the integrated circuits. Also, the electro-migration resistance of the resulting bonding structure is low.

SUMMARY

In accordance with one aspect of the embodiment, an integrated circuit structure includes a first work piece and a second work piece. The first work piece includes a copper bump at a main surface of the first work piece and having a first dimension; and a nickel-containing barrier layer over and adjoining the copper bump. The second work piece is bonded to the first work piece and includes a bond pad at a main surface of the second work piece; and a solder mask at the main surface of the second work piece and having a solder resist opening with a second dimension exposing a portion of the bond pad. A ratio of the first dimension to the second dimension is greater than about 1. Further, a solder region electrically connects the copper bump to the bond pad, with a vertical distance between the bond pad and the copper bump being greater than about 30 μm.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel integrated circuit structure is provided in accordance with an embodiment. The variations of the embodiment are discussed. Throughout the various views and illustrative embodiments, like reference numbers are used to designate like elements.

Figure 1A:
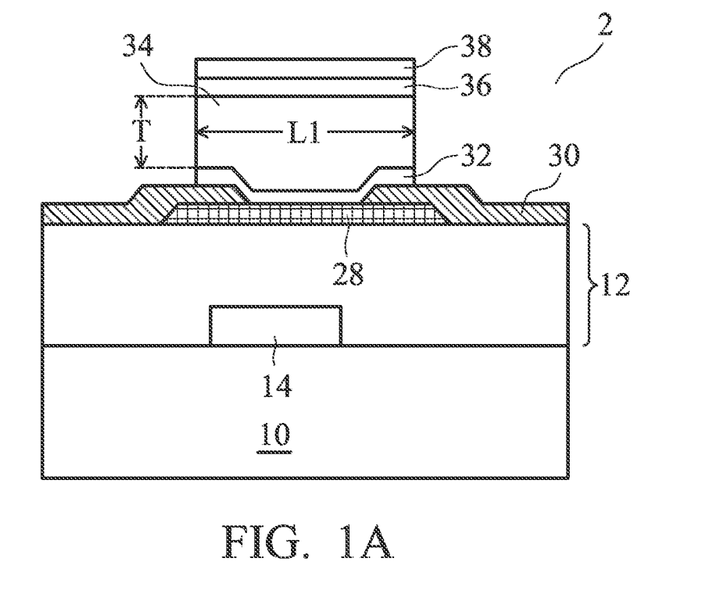
FIGS. 1A and 1B are cross-sectional views of semiconductor chips comprising copper bumps.

Referring to FIG. 1A, work piece 2, which may be a semiconductor chip that includes substrate 10, is provided. Throughout the description, work piece 2 is alternatively referred to as chip 2, although it may also be a package substrate, an interposer substrate, or the like. In an embodiment, substrate 10 is a semiconductor substrate, such as a silicon substrate, although it may include other semiconductor materials, such as group III, group IV, and/or group V elements. Semiconductor devices 14, such as transistors, may be formed at the surface of substrate 10. Interconnect structure 12, which includes metal lines and vias (not shown) formed therein and connected to semiconductor devices 14, is formed over substrate 10. The metal lines and vias may be formed of copper or copper alloys and may be formed using well-known damascene processes. Interconnect structure 12 may include commonly known inter-layer dielectrics (ILDs) and inter-metal dielectrics (IMDs).

Metal pad 28 is formed over interconnect structure 12. Metal pad 28 may comprise aluminum, copper (Cu), silver (Ag), gold (Au), nickel (Ni), tungsten (W), alloys thereof, and/or multi-layers thereof. Metal pad 28 may be electrically connected to semiconductor devices 14, for example, through the underlying interconnection structure 12. Passivation layer 30 may be formed to cover edge portions of metal pad 28. In an exemplary embodiment, passivation layer 30 is formed of polyimide or other known dielectric materials, such as silicon oxide, silicon nitride, and multi-layers thereof.

Under bump metallurgy (UBM) 32 is formed on, and electrically connected to, metal pad 28. UBM 32 may include a copper layer and a titanium layer (not shown). Copper bump 34 is formed on UBM 32. In an embodiment, copper bump 34 is formed by plating. An exemplary plating process includes forming a UBM layer, forming a mask on the UBM layer, patterning the mask to form an opening, plating copper bump 34 in the opening, and removing the mask and resulting uncovered portions of the UBM layer. Copper bump 34 may be formed of substantially pure copper, which may have a copper atomic percentage greater than about 95 percent, or even greater than about 99 percent. Thickness T of copper bump 34 may be greater than about 30 μm, or even greater than about 45 μm. Thickness T may also be less than about 60 μm. Copper bump 34 may have a horizontal dimension (a length or a width) L1, which may be between about 80 μm and about 110 μm. Dimension L1 may be measured in a plane parallel to the top or the bottom surface of work piece 2. One skilled in the art will realize, however, that the dimensions recited throughout the description are merely examples and will change if different formation technologies are used.

Barrier layer 36 is formed on copper bump 34, for example, by plating. Barrier layer 36 may be formed of nickel or nickel alloys, and hence is alternatively referred to as nickel (containing) barrier layer 36 hereinafter, although it may also be formed of other metals. Solder layer 38 may be formed on nickel barrier layer 36. Solder layer 38 may be relatively thin, for example, with a thickness less than about 35 μm, and may be formed by plating using a same mask (not shown) as the mask for plating copper bump 34 and nickel barrier layer 36. Accordingly, edges of solder layer 38 and nickel barrier layer 36 may be vertically aligned to respective edges of copper bump 34. In other words, solder layer 38 and nickel barrier layer 36 may be limited in the region directly over copper bump 34. An exemplary thickness of nickel barrier layer 36 is greater than about 0.1 μm. Solder layer 38 may have a thickness less than about 35 μm, or between about 1 μm and about 35 μm.

Figure 1B:
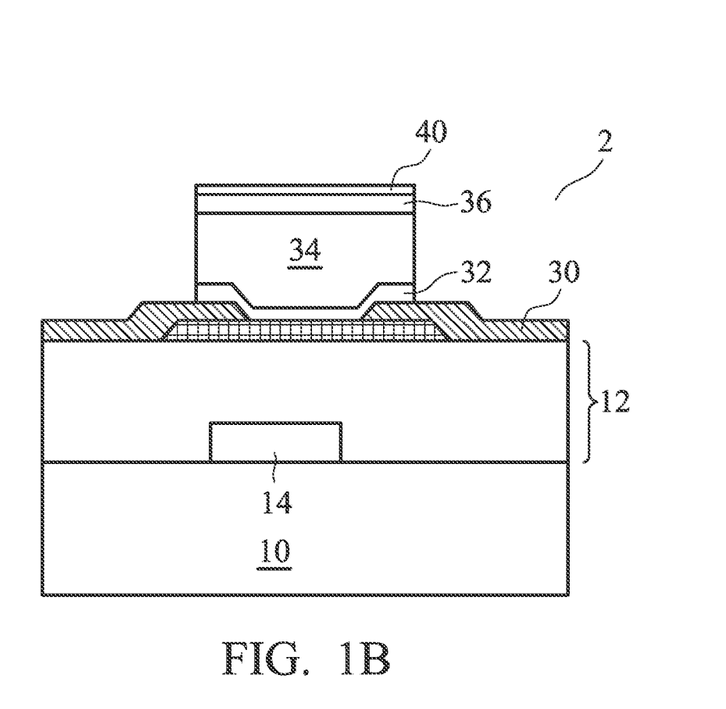

In alternative embodiments, as shown in FIG. 1B, no solder layer 38 is formed, instead, gold-containing layer 40 is formed over and contacting copper bump 34. Copper bump 34, nickel barrier layer 36, and/or gold-containing layer 40 may be plated using a same mask (not shown) as the mask for plating copper bump 34, and hence nickel barrier layer 36 and/or gold-containing layer 40 are limited in the region directly over copper bump 34, and are not formed on sidewalls of copper bump 34. In alternative embodiments, nickel barrier layer 36 and/or gold-containing layer 40 are plated after the removal of the mask that is used for plating copper bump 34. As a result, nickel barrier layer 36 and/or gold-containing layer 40 are also formed on the sidewalls of copper bump 34. Gold-containing layer 40 may have a thickness less than about 1 μm.

Figure 2:
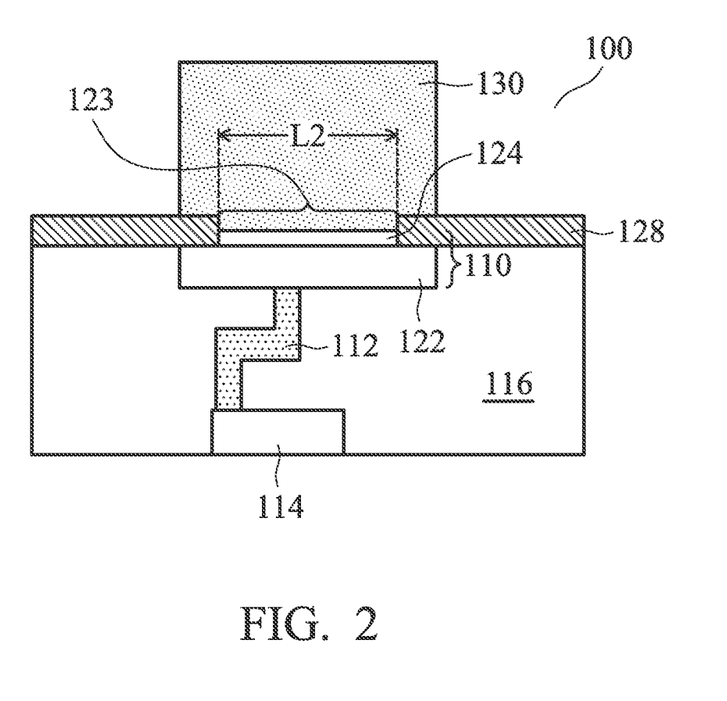
FIG. 2 illustrates a package substrate comprising a bond pad with a solder ball mounted on the bond pad.

FIG. 2 illustrates work piece 100. In an embodiment, work piece 100 is a package substrate (and hence is referred to as package substrate 100 hereinafter), although it may also be a semiconductor chip, an interposer substrate, or the like. Package substrate 100 includes bond pad 110, which is electrically connected to bond pad 114 through metal interconnection 112. Bond pad 114 and bond pad 110 are on opposite sides of package substrate 100. Metal interconnection 112 may be formed in dielectric substrate 116.

Bond pad 110 comprises metal pad 122, which may be formed of copper (for example, pure or substantially pure copper), aluminum, silver, and/or alloys thereof. Barrier layer 124 may optionally be formed over metal pad 122, for example, by electroless or electro plating. Barrier layer 124 may be formed of nickel or nickel alloys, although other metals may be added. Solder mask 128 is formed over metal pad 122, and has a solder resist opening (SRO) 123 through which bond pad 110 is exposed. In an embodiment, SRO 123 has a dimension L2, which may be smaller than about 100 μm, and may be between about 60 μm and about 100 μm, for example.

Solder layer 130 is mounted on bond pad 110. In an embodiment, solder layer 130 is formed of a lead-free solder material containing, for example, SnAg, SnAgCu, or the like, although solder layer 130 may also be formed of eutectic solder material containing, for example, lead (Pb) and tin (Sn).

Figure 3:
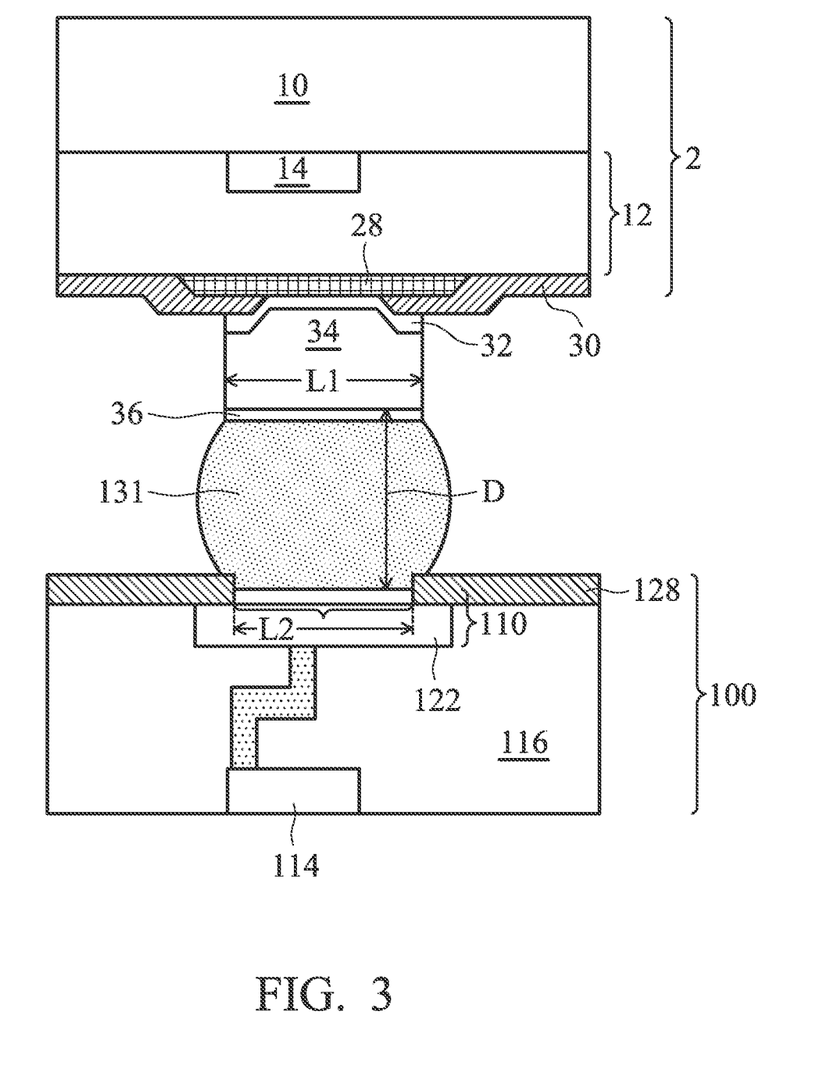
FIG. 3 illustrates the bonding of the structure shown in FIGS. 1A/1B to the structure shown in FIG. 2.

Work piece 2 as shown in either FIG. 1A or FIG. 1B may be bonded to work piece 100 through flip-chip bonding, as shown in FIG. 3. A high temperature process, such as reflow or thermal compression bonding, is performed to melt solder layer 130 and solder layer 38. Solder layer 130 thus joins work piece 2 and work piece 100 together and electrically connects copper bump 34 to bond pad 110. The reflowed region by melting solder layer 130 and the solder layer 38 is referred to as solder joint region 131 hereinafter. In some embodiments, after the reflow, solder joint region 131 contacts the surface barrier layer 36, which surface faces work piece 2, and substantially does not contact the sidewalls of copper bump 34. Barrier layer 36 and solder joint region 131 have an interface, which interface also has a dimension substantially equal to L1.

In the resulting structure shown in FIG. 3, a ratio of dimension L1 to dimension L2 (L1/L2) is greater than 1. The ratio may also be greater than 1.15. The distance D between copper bump 34 and bond pad 110 may be greater than about 30 μm, or even greater than about 40 μm. In the embodiments that the surface of copper bump 34 is not flat, distance D is measured at the corners of copper bump 34 rather than at the center (as shown with a dotted line and arrows). Accordingly, distance D may be equal to the total thickness of solder joint region 131 and the thickness of nickel barrier layer 36, and possibly gold-containing layer 40, if it exists. The criticality of distance D and ratio L1/L2 is discussed in following paragraphs.

Figure 4:
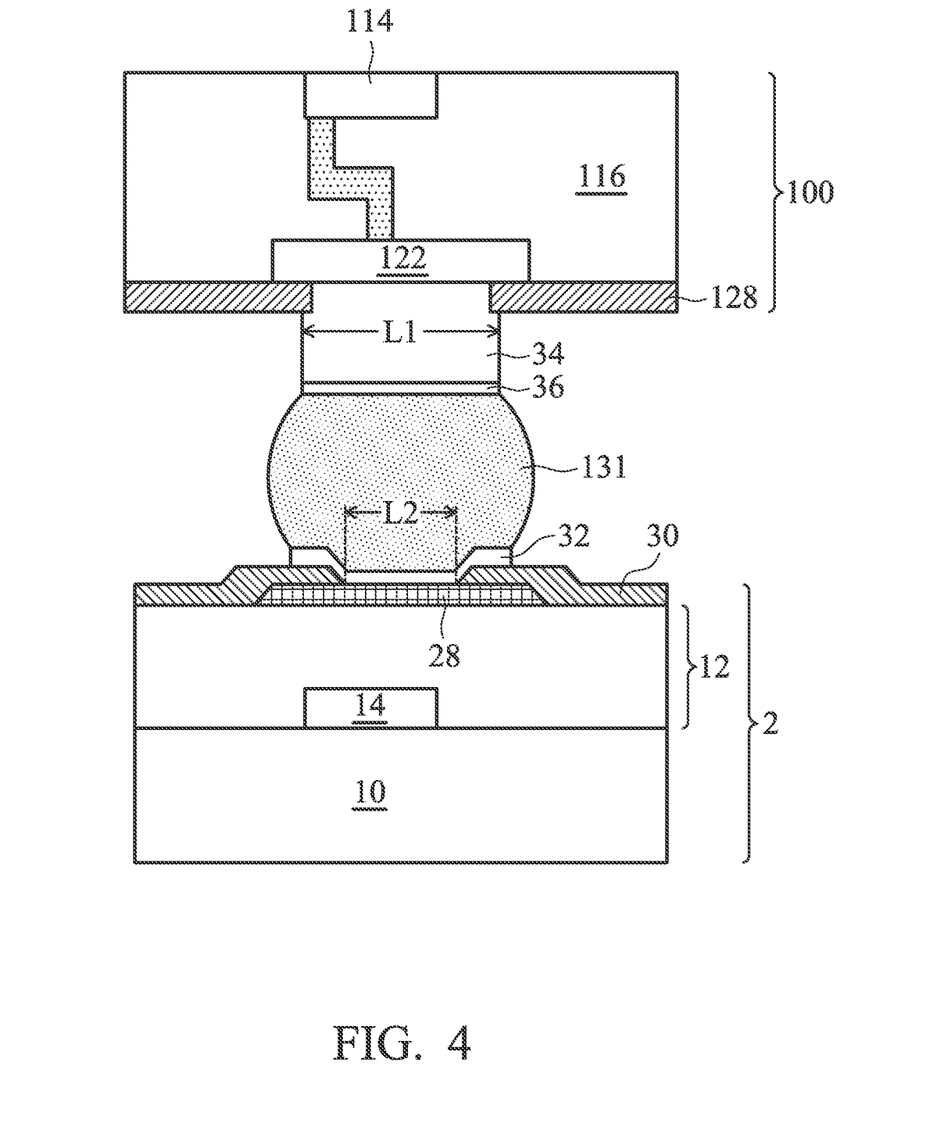
FIG. 4 illustrates a package in accordance with an alternative embodiment.

FIG. 4 illustrates an alternative embodiment wherein copper bump 34 and nickel barrier layer 36 (or gold-containing layer 40, not shown in FIG. 4, please refer to FIG. 1B) are formed on the side of package substrate 100, while solder layer 130 (please refer to FIG. 2) is pre-mounted on the side of semiconductor chip 2 before the bonding of package substrate 100 and semiconductor chip 2.

Figure 5:
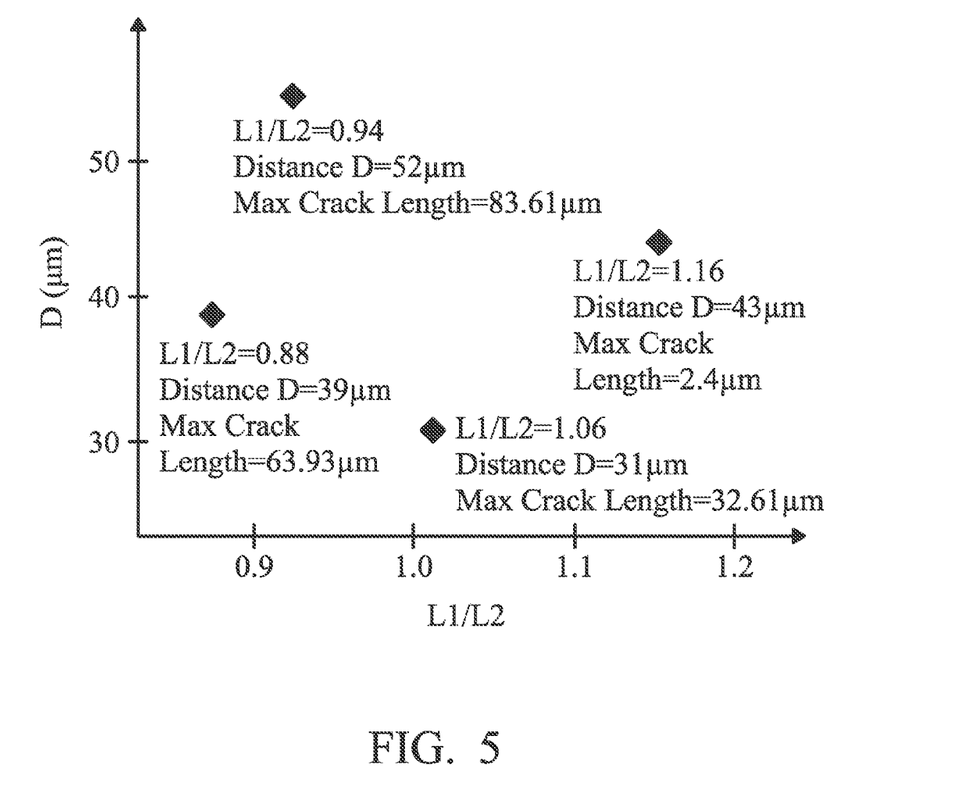
FIG. 5 illustrates experiment results.

FIG. 5 illustrates some experiment results, which reveal the criticality of the values of distance D and ratio L1/L2 (refer to FIG. 3). Unexpected results were found in the experiment results. The X-axis indicates the ratio L1/L2. The Y-axis indicates distance D. A plurality of sample wafers is made with different L1/L2 ratios and different distances D. The maximum length of the cracks in solder joint region 131 (refer to FIG. 3) of each of the sample wafers was measured. It was found that the maximum lengths of the cracks are functions of ratios L1/L2 and distances D, and unexpectedly, when ratio L1/L2 and distance D increase to certain levels, the cracks in solder joint region 131 may be substantially eliminated. It was observed that with the increase in ratios L1/L2 and/or the increase in distances D, the maximum lengths of the cracks in solder joint region 131 became smaller. The experiment results revealed that when ratio L1/L2 is greater than about 1.15, and distance D is greater than about 40 µm, the maximum lengths of the cracks in the respective wafer may be reduced to an acceptable level, for example, less than about 15 µm, and sometimes the cracks may be substantially eliminated. On the other hand, if either ratio L1/L2 is smaller than about 1.15, and/or distances D is greater than 40 µm, the maximum lengths of the cracks significantly increase, sometimes to about 83 µm or even greater. A possible explanation is that the stresses at the corners of copper bumps 34 are high and the stresses at the corners of bond pad 110 (at the intersection of bond pad 110 and solder joint region 131) are also high. By separating the high-stress regions far enough, the multiplication effect is substantially eliminated and hence the stress is reduced to a level lower than the threshold for generating cracks. The increase in ratio L1/L2 further results in the spreading of stress.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a first work piece comprising:
      an under bump metallurgy (UBM) at a main surface of the first work piece;
      a copper bump over the UBM and having a first dimension in a first plane parallel to the main surface of the first work piece; and
      a nickel-containing barrier layer over and adjoining the copper bump;
   a second work piece bonded to the first work piece and comprising:
      a bond pad at a main surface of the second work piece; and
      a solder mask at the main surface of the second work piece and having a solder resist opening with a second dimension exposing a portion of the bond pad, wherein the second dimension is measured in a second plane parallel to the main surface of the second work piece, and wherein a ratio of the first dimension to the second dimension is greater than about 1; and
   a solder region electrically connecting the copper bump to the bond pad, wherein the solder region contacts a surface of the nickel-containing barrier layer facing the second work piece to form an interface, and substantially does not contact sidewalls of the copper bump, wherein the interface has a dimension substantially equal to the first dimension.

2. The integrated circuit structure of claim 1, wherein the first work piece is a semiconductor chip comprising integrated circuits, and the second work piece is a package substrate.

3. The integrated circuit structure of claim 1, wherein the first work piece is a package substrate, and the second work piece is a semiconductor chip comprising integrated circuits.

4. The integrated circuit structure of claim 1, wherein the copper bump has a thickness less than about 60 µm.

5. The integrated circuit structure of claim 1, wherein the ratio of the first dimension to the second dimension is further greater than about 1.15.

6. The integrated circuit structure of claim 1, wherein the vertical distance between the bond pad and the copper bump is further greater than about 40 µm.

7. The integrated circuit structure of claim 1 further comprising a gold-containing layer between the solder region and the nickel-containing barrier layer.

8. The integrated circuit structure of claim 1, wherein the bond pad of the second work piece comprises copper.

9. An integrated circuit structure comprising:
   a package substrate comprising:
      a copper bump at a main surface of the package substrate and having a first dimension in a first plane parallel to the main surface of the package substrate; and
      a nickel-containing barrier layer over and adjoining the copper bump;
   a semiconductor chip comprising integrated circuits therein, wherein the semiconductor chip comprises:
      a bond pad at a main surface of the semiconductor chip; and
      a solder mask at the main surface of the semiconductor chip and having a solder resist opening with a second dimension exposing a portion of the bond pad, wherein the second dimension is measured in a second plane parallel to the main surface of the semiconductor chip, and wherein a ratio of the first dimension to the second dimension is greater than about 1; and
   a solder region electrically connecting the copper bump to the bond pad, wherein a vertical distance between the bond pad and the copper bump is greater than about 30 µm.

10. The integrated circuit structure of claim 9, wherein the copper bump has a thickness less than about 60 µm.

11. The integrated circuit structure of claim 9, wherein the ratio of the first dimension to the second dimension is further greater than about 1.15.

12. The integrated circuit structure of claim 9, wherein the vertical distance between the bond pad and the copper bump is further greater than about 40 µm.

13. The integrated circuit structure of claim 9 further comprising a gold-containing layer between the solder region and the nickel-containing barrier layer.

14. The integrated circuit structure of claim 9, wherein the bond pad of the semiconductor chip comprises copper.

15. The integrated circuit structure of claim 9 further comprising an under bump metallurgy (UBM) at the main surface of the package substrate and underlying the copper bump.

\* \* \* \* \*